US006839177B2

(12) United States Patent
Aspen (10) Patent No.: US 6,839,177 B2
(45) Date of Patent: Jan. 4, 2005

(54) ANTI-REFLECTIVE COATING FOR HOLOGRAPHIC DATA STORAGE MEDIA

(75) Inventor: Frank E. Aspen, St. Paul, MN (US)

(73) Assignee: Imation Corp., Oakdale, MN (US)

( * ) Notice: Subject to any disclaimer, the term of this patent is extended or adjusted under 35 U.S.C. 154(b) by 375 days.

(21) Appl. No.: 10/075,901

(22) Filed: Feb. 14, 2002

(65) Prior Publication Data

US 2003/0151814 A1 Aug. 14, 2003

(51) Int. Cl.[7] .......................... G02B 1/10; G02B 27/28; G02B 5/32
(52) U.S. Cl. ....................... 359/586; 359/580; 359/588; 359/498; 359/495; 359/15
(58) Field of Search ................................. 359/586, 580, 359/588, 498, 495, 15, 584, 587, 359, 35, 24

(56) References Cited

U.S. PATENT DOCUMENTS 5,912,762 A * 6/1999 Li et al. ..................... 359/352

6,271,968 B1 * 8/2001 Dobrowolski et al. ...... 359/583
6,563,977 B1 * 5/2003 Chen et al. .................... 385/24
6,574,039 B1 * 6/2003 Murata et al. ............... 359/359

FOREIGN PATENT DOCUMENTS

JP          11212434        8/1999

OTHER PUBLICATIONS

"A broadband antireflection coating for enhanced holographic recording and readout in bismuth silicon oxide," Karim et al., Appl. Phys. Lett. 70 (21), May 26, 1997, pp. 2793–2795.

* cited by examiner

Primary Examiner—Audrey Chang
(74) Attorney, Agent, or Firm—Eric D. Levinson

(57) ABSTRACT

A holographic data storage medium having an anti-reflective coating is described. The anti-reflective coating can be made to reduce reflectivity for S-polarized light over a wide range of incident angles. Moreover, the anti-reflective coating can be made to have a sufficiently high transmittance for the S-polarized light. The coating may improve performance of the holographic data storage medium, and can facilitate higher storage densities than can be achieved without the coating.

21 Claims, 7 Drawing Sheets

ANTI-REFLECTIVE COATING FOR HOLOGRAPHIC DATA STORAGE MEDIA

FIELD

The invention relates to holographic data storage media, and more particularly to anti-reflective coatings for holographic data storage media.

BACKGROUND

Many different types of data storage media have been developed to store information. Traditional media, for instance, include magnetic media, optical media, and mechanical media to name a few. Increasing data storage density is a paramount goal in the development of new or improved types of data storage media.

In traditional media, individual bits are stored as distinct mechanical, optical, or magnetic changes on the surface of the media. For this reason, medium surface area imposes physical limits on data densities for a given recording technique.

Holographic data storage media can offer higher storage densities than traditional media. In a holographic medium, data can be stored throughout the volume of the medium rather than the medium surface. In other words, holographic media permit three-dimensional data storage. Theoretical holographic storage densities can approach tens of terabits per cubic centimeter.

In holographic data storage media, entire pages of information, e.g., bitmaps, can be stored as optical interference patterns within a photosensitive optical material. This can be done by intersecting two coherent laser beams within the optical material. The first laser beam, called the object beam, contains the information to be stored; and the second, called the reference beam, interferes with the object beam to create an interference pattern that can be stored in the optical material as a hologram. When the stored hologram is later illuminated with only the reference beam, some of the light of the reference beam is diffracted by the holographic interference pattern. Moreover, the diffracted light creates a reconstruction of the original object beam. Thus, by illuminating a recorded hologram with the reference beam, the data encoded in the object beam can be recreated and detected by a data detector such as a camera.

SUMMARY

In general the invention is directed to a holographic medium having an anti-reflective coating. The anti-reflective coating is designed to reduce reflectivity for S-polarized light, over a wide range of incident angles. S-polarized light refers to the light component of a laser beam having an electric vector that points in a direction perpendicular to the incident plane of the laser beam. By reducing reflectivity for S-polarization on the surface of the holographic medium to less than one percent at incident angles greater than approximately 50 degrees relative to a line normal to the medium surface, increased data storage capacity can be achieved. In some cases, reflectivity of S-polarization can be made less than one percent for a wide range of incident angles, such as incident angles between approximately 10 degrees and 60 degrees relative to a line normal to the medium surface. Such anti-reflective characteristics are particularly useful for holographic data storage media used in systems that implement angle-multiplexing techniques.

In one embodiment, the invention is directed to a holographic data storage medium including an anti-reflective coating on a surface of the medium, wherein the anti-reflective coating causes the medium to have less than 1.0 percent reflectivity of S-polarized light at incident angles greater than approximately 50 degrees relative to a line normal to the medium surface. More specifically, reflectivity of S-polarized light can be made less than one percent for incident angles between approximately 10 degrees and 60 degrees relative to a line normal to the medium surface. The holographic data storage medium may have a sandwich construction in which a photopolymer is sandwiched between two substrates. In that case, the anti-reflective coating on a surface of the medium may comprise anti-reflective coatings on one or both of the substrates.

The invention may provide a number of advantages. For example, by reducing reflectivity on the surface of the holographic data storage medium, the invention can reduce the amount of background light (noise) within the holographic data recording system. This reduction in noise, in turn, may improve the performance of the system by avoiding degradation of the signal-to-noise ratio during recording or read-back. In addition, reducing surface reflectivity of a holographic data storage medium can increase the data storage capacity of the medium, particularly when reflectivity is reduced for a wide range of incident angles.

For example, holographic bit maps may be stored throughout the volume of a holographic data storage medium. To make efficient use of the available recording volume, bit maps may be recorded in the medium and read from the medium using one or more lasers directed at the medium at different incident angles. A reduction in reflectivity at over a wide range of incident angles can allow a wider range of angles to be used for the holographic recording and read-out. In this manner, reductions in reflectivity can result in more available incident angles, and thus, the ability to store more holographic bit maps within the available volume of the medium.

Additional details of these and other embodiments are set forth in the accompanying drawings and the description below. Other features, objects and advantages will become apparent from the description and drawings, and from the claims.

DETAILED DESCRIPTION

The invention is directed to a holographic data storage medium having an anti-reflective coating. As described in greater detail below, the anti-reflective coating can be designed to reduce reflectivity for S-polarized light over a wide range of incident angles. The invention may be particularly useful in reducing reflectivity for S-polarized light at high incident angles. Moreover, the anti-reflective coating can be made to have a sufficiently high transmittance for the S-polarized light. The coating may improve performance of the holographic data storage medium, and facilitate higher storage densities than can be achieved without the coating.

Figure 1:
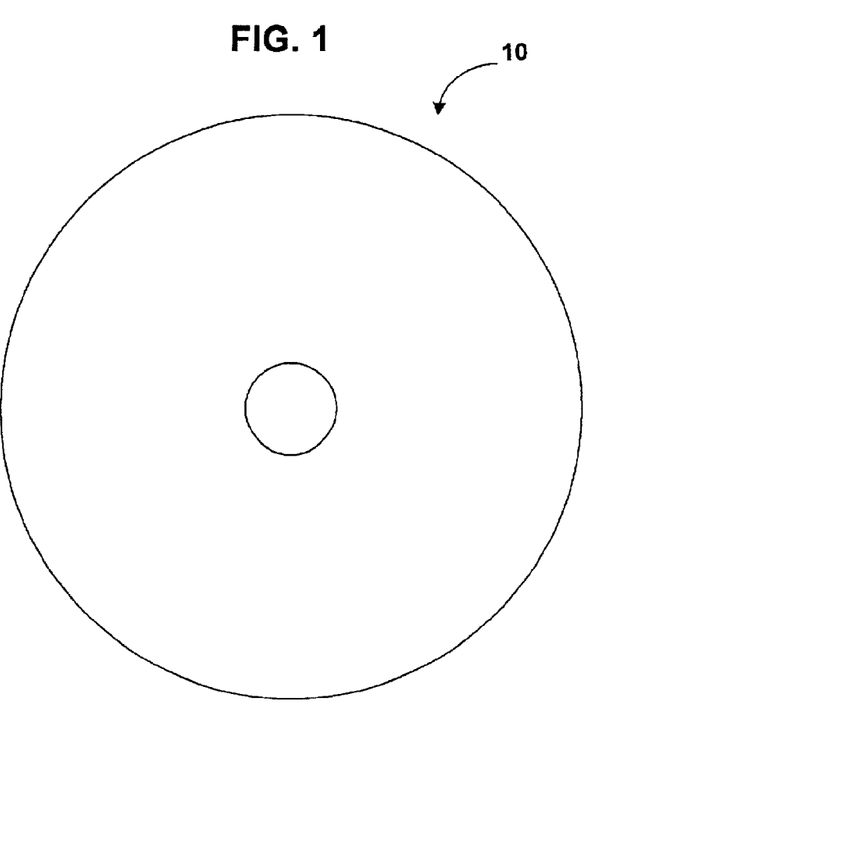
FIG. 1 is a top view of an exemplary holographic data storage medium according to an embodiment of the invention.
Figure 2:
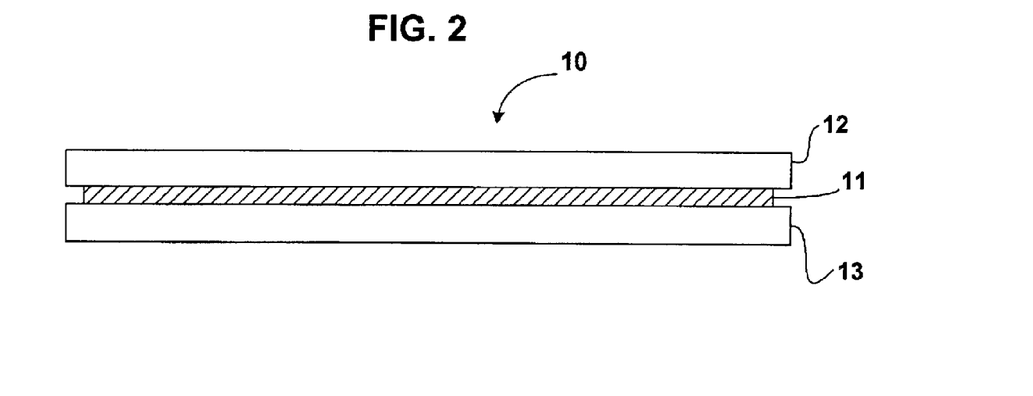
FIG. 2 is a cross-sectional side view of an exemplary holographic data storage medium according to an embodiment of the invention.

FIG. 1 is a top view of an exemplary holographic data storage medium 10. FIG. 2 is a cross-sectional side view of holographic data storage medium 10. As shown, holographic data storage medium 10 has a sandwich construction in which a holographic recording material 11 is sandwiched between two substrates 12, 13. By way of example, substrates 12, 13 may comprise an optically transparent material such as an optically transparent thermoplastic or other material. Examples materials useful in forming substrates 12, 13 include: polycarbonate, polymethylmethacrylate (PMMA), amorphous polyolefin, and glass. The holographic recording material 11 can be made of a photopolymer.

As illustrated in FIG. 1, the holographic data storage medium 10 may take the form of a rotatable disk. Alternatively, holographic data storage medium 10 may take the form of a rectangular card, or any other shape. In every case, holographic data storage medium 10 includes an anti-reflective coating on an outer surface of at least one substrate 12, 13. The anti-reflective coating can reduce reflectivity for S-polarized light, over a wide range of incident angles. In some cases, the same anti-reflective coating may be provided on outer surfaces of both substrates 12, 13 of holographic data storage medium 10.

In electromagnetic wave propagation, properties of reflected and transmitted waves are dependent on the interface conditions. At a substrate boundary, the electric and magnetic field vectors for incident electromagnetic waves can be split into two polarization components. The two polarization components are defined relative to an incident plane of the incoming light, i.e., the incident plane of a laser beam used in holographic data recording or readout.

The first component is referred to as P-component or P-polarized light. P-polarized light is the light component having an electric vector that points in a direction parallel to the incident plane. The other component is referred to as the S-component or S-polarized light. S-polarized light is the light component having an electric vector that points in a direction perpendicular to the incident plane. For holographic data recording and readout, it is particularly desirable to minimize the reflection of S-polarized light because S-polarization is more efficient for holographic data storage.

Figure 3:
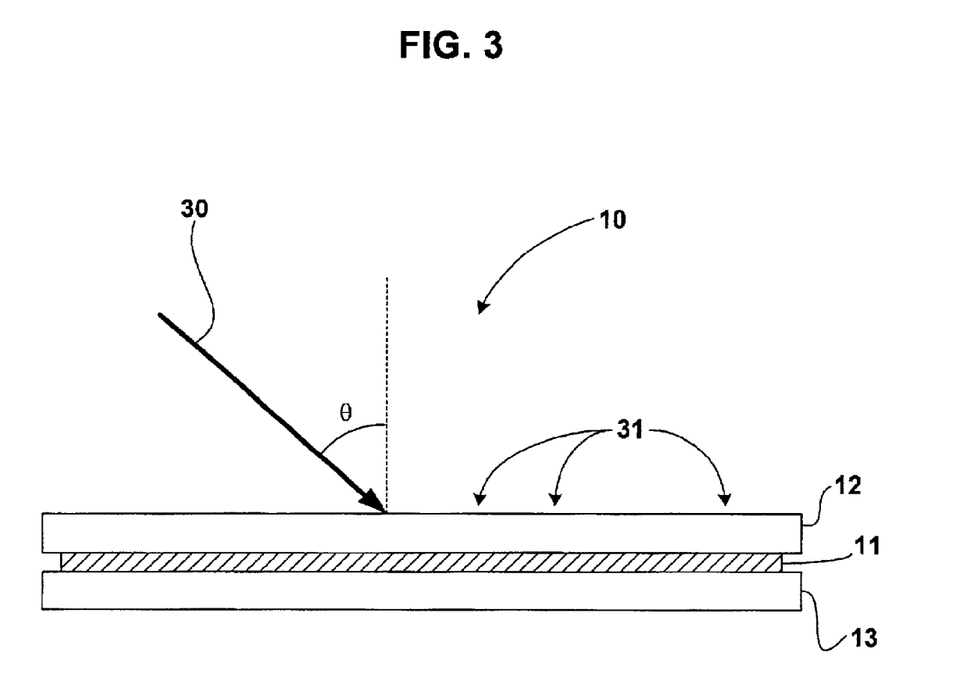
FIG. 3 is another cross-sectional side view of an exemplary holographic data storage medium according to an embodiment of the invention.

FIG. 3 is another cross-sectional side view of holographic data storage medium 10. Surface 31 of holographic data storage medium 10 includes an anti-reflective coating. For holographic data recording and holographic data readout, a laser beam 30 is directed toward holographic data storage medium. Laser beam 30 may comprise the object beam used for holographic recording, or the reference beam used for recording and readout. Laser beam 30 may be conditioned by one or more lenses or other optical elements prior to being directed at medium 10.

The incident angle $\theta$ defines the direction of laser beam 30 relative to a line normal to the planar surface of medium 10. At low incident angles, reflection is less of a concern. However, as incident angle $\theta$ is increased beyond 50 degrees relative to a line normal to the planer surface of medium 10, reflection may be more problematic. For example, reflected S-polarized light may add significant amounts of noise within a holographic data storage system, which can impact system performance by degrading the signal-to-noise ratio. Providing an anti-reflective coating on surface 31 can reduce reflection of S-polarized light, and thus reduce noise in the system. Furthermore, providing an anti-reflective coating on surface 31 can increase the data storage capacity of medium 10, particularly when angle-multiplexing is used.

In angle-multiplexing, the volume of holographic recording material 11 is utilized to store a number of bit maps by recording each bit map using laser beams directed at medium 30 at different incident angles $\theta$. In some cases, the laser beams used to record multiplexed bit maps may be directed toward approximately the same surface location, but at different incident angles $\theta$. An anti-reflective coating can increase the range of angles that can be used to record bit maps at approximately the same surface location.

Figure 4:
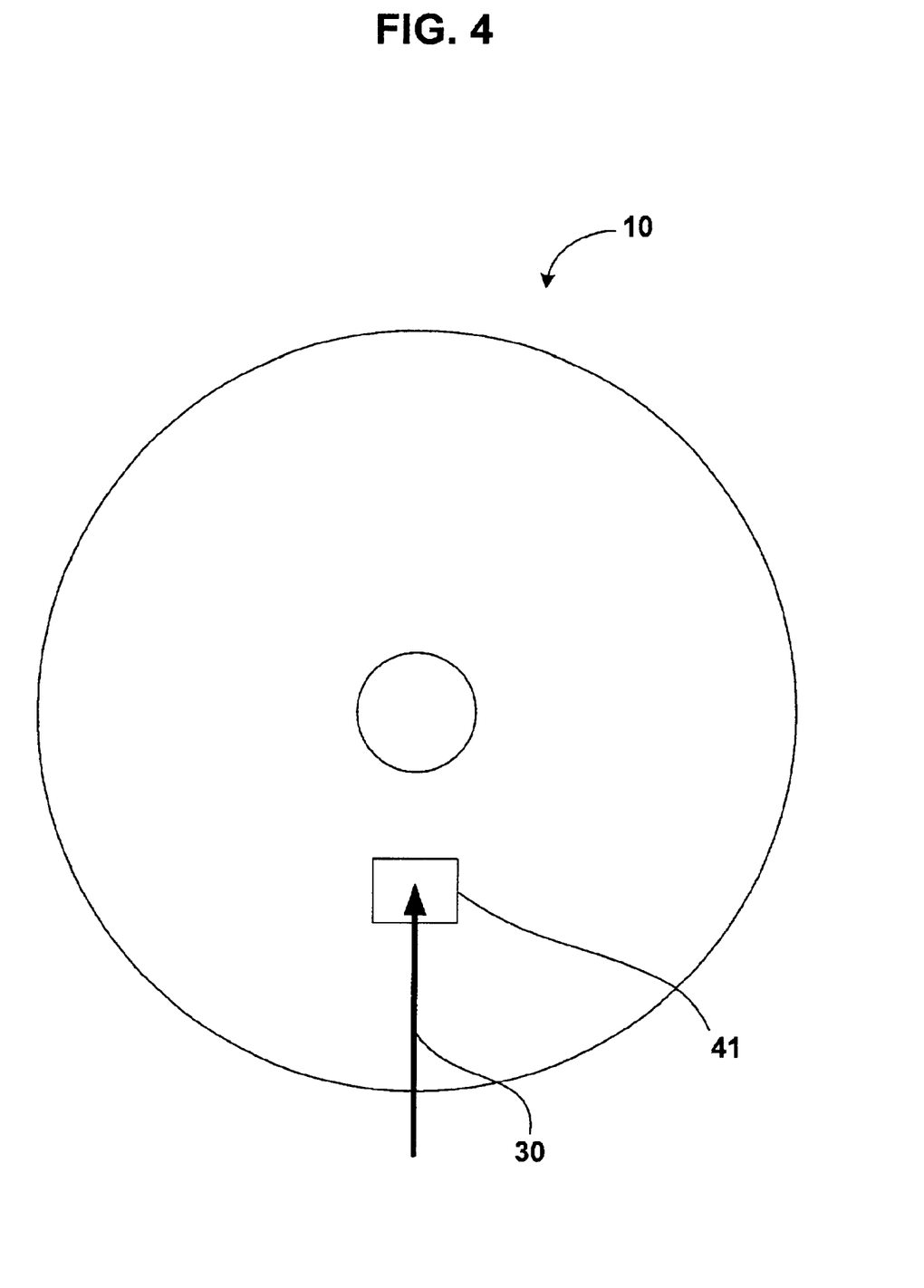
FIG. 4 is another top view of an exemplary holographic data storage medium according to an embodiment of the invention.

FIG. 4 is another top view of holographic data storage medium 10. As shown, laser beam 30 can be directed toward area 41 to record a bit map, or to reconstruct a stored bit map within the holographic storage material associated with area 41. FIG. 4 is greatly simplified for illustrative purposes. In actuality, holographic recording involves separating a laser beam into an object beam and a reference beam. The object beam is encoded with the bit map, and then the object beam and reference beam are made to interfere with one another at location 41 to create a hologram on medium 10. For readout of the data, only the reference beam is allowed to illuminate the hologram on medium 10. Light diffracts off the hologram stored on medium 10 to reconstruct or "recreate" the object beam, or a beam of light that is substantially equivalent to or otherwise indicates the contents of the original encoded object beam. The bit map that was encoded in the object beam can then be decoded from the reconstructed object beam by a data detector, such as a camera.

Figure 5:
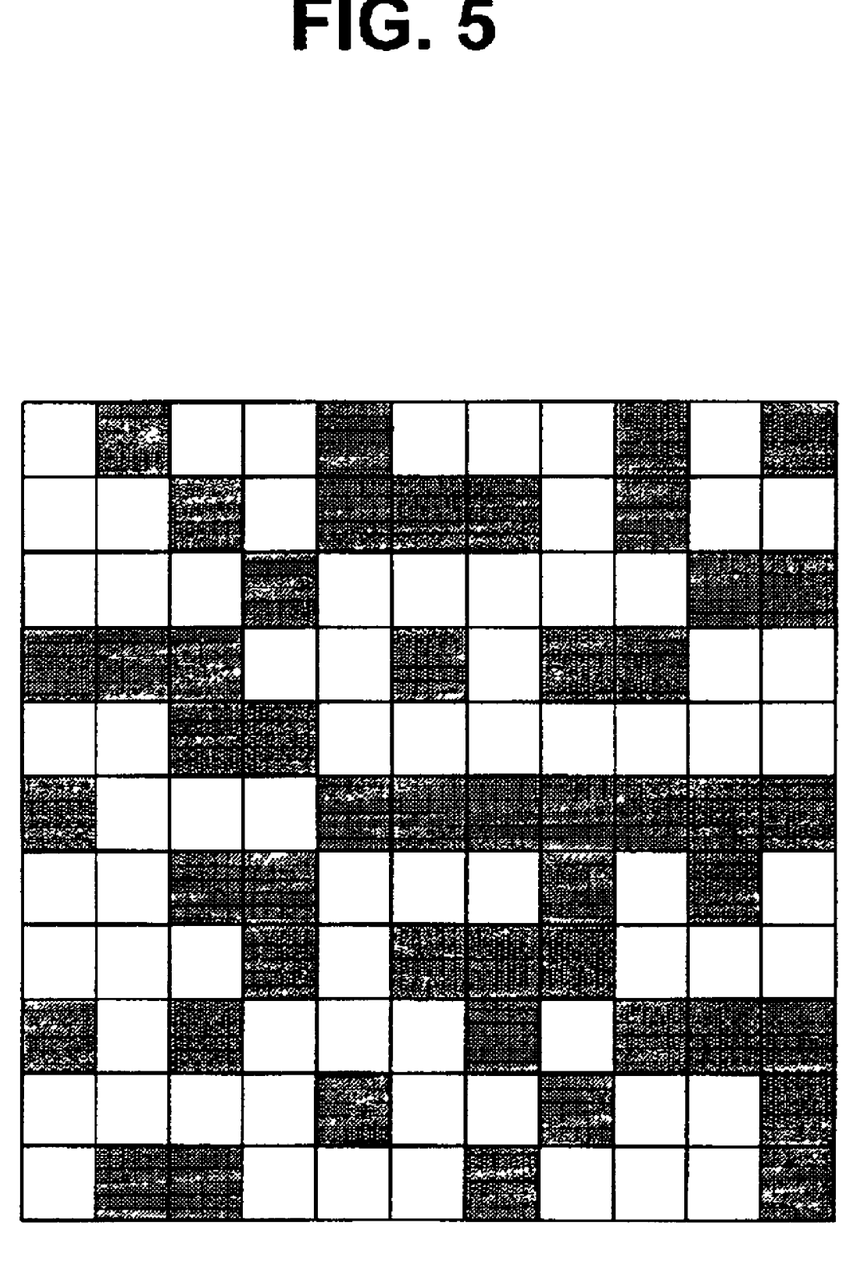
FIG. 5 illustrates an exemplary holographic bit map according to an embodiment of the invention.

The holographic bit maps stored on holographic data storage medium 10 may comprise "pages" of holographic data. For instance, the pages may be arrays of binary information that are stored within the holographic medium as holograms. By way of example, a typical page of holographic data may comprise a 1000-bit by 1000-bit pixel array that is stored in the volume of recording material associated with 1 square millimeter of medium surface area, although the scope of the invention is not limited in that respect. FIG. 5 is a more simplified illustration of an 11-bit by 11-bit pixel array that can be stored as a hologram.

Figure 6:
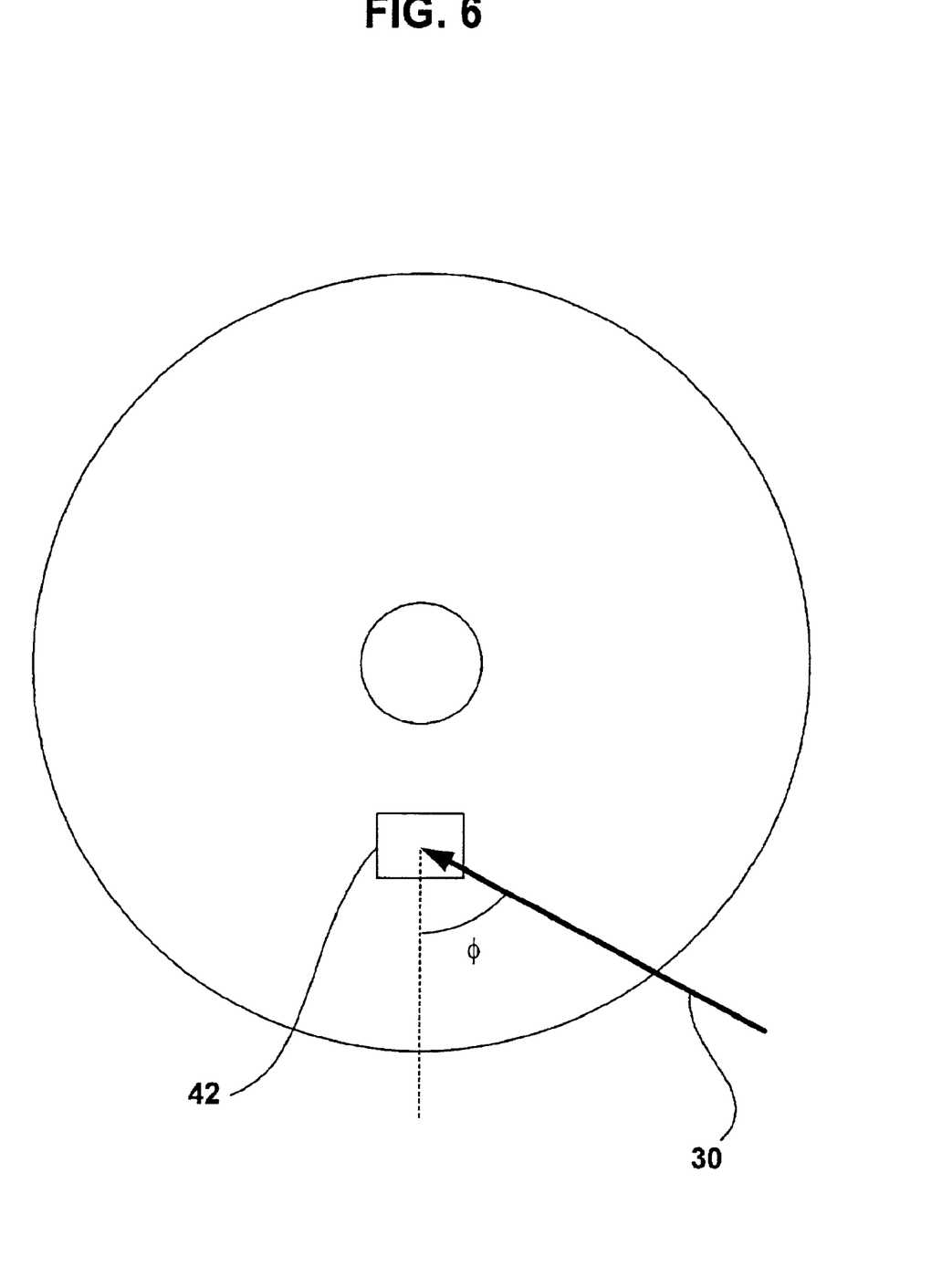
FIG. 6 is another top view of an exemplary holographic data storage medium according to an embodiment of the invention.

Referring again to FIG. 4, in angle-multiplexing, a number of pages of holographic data can be stored within area 41 by using different recording angles θ (FIG. 3). Moreover, for each angle θ that is used for holographic data storage, there are 360 degrees of angles φ that can be used for angle-multiplexing. For example, as illustrated in FIG. 6, for each angle θ, a number of pages of holographic data can be stored within area 41 by changing the recording angle φ. In this manner, angle-multiplexing can make efficient use of the available volume of holographic recording material associated with area 41.

Other types of multiplexing, such as shift-multiplexing may also be used. In shift-multiplexing, pages of holographic data are typically recorded using the same incident angle. However, sequential pages are recorded at shifted locations around the medium. The shift distances are typically much less than the recorded area in one or more dimensions. The anti-reflective coatings described in greater detail below may be adjusted for use in systems implementing shift-multiplexing. In that case, it may be desirable to substantially minimize reflectivity of S-polarized light specifically for a particular incident angle used. In particular, the invention may facilitate the ability to use larger incident angles with shift-multiplexing techniques.

In order to facilitate larger incident angles θ for holographic recording and readout, medium 10 includes an anti-reflective coating on its surface. The anti-reflective coating reduces reflectivity for S-polarization particularly at high incident angles, such as incident angles greater than 50 degrees relative to a line normal to the medium surface. In particular, the anti-reflective coating causes the medium to have less than 1.0 percent reflectivity of S-polarized light at incident angles greater than approximately 50 degrees relative to a line normal to the surface of the medium. In some cases, less than 1.0 percent reflectivity of S-polarized light at a wide range of incident angles, such as incident angles approximately between the range of 10 degrees to 60 degrees can be achieved. Indeed, in the example coatings discussed below, less than 0.5 percent reflectivity, or even less than 0.25 percent reflectivity can be achieved at an incident angle within the range of 10 degrees to 60 degrees relative to a line normal to the surface of the medium.

At the same time, the anti-reflective coating can be made to have a sufficiently high transmittance for the S-polarized light. If too much light is absorbed by the anti-reflective coating, recording and readout can be undermined. Thus, it is desirable to ensure that high levels of transmittance are maintained. For example, in exemplary embodiments, transmittance for the S-polarized light of greater than 95 percent can be achieved without causing reflectivity to deviate from the ranges listed above. Also, the transmittance for the S-polarized light of greater than 95 percent can be maintained at the high incident angles and ranges of incident angles listed herein. In this manner, improved holographic data storage media can be realized.

Figure 7:
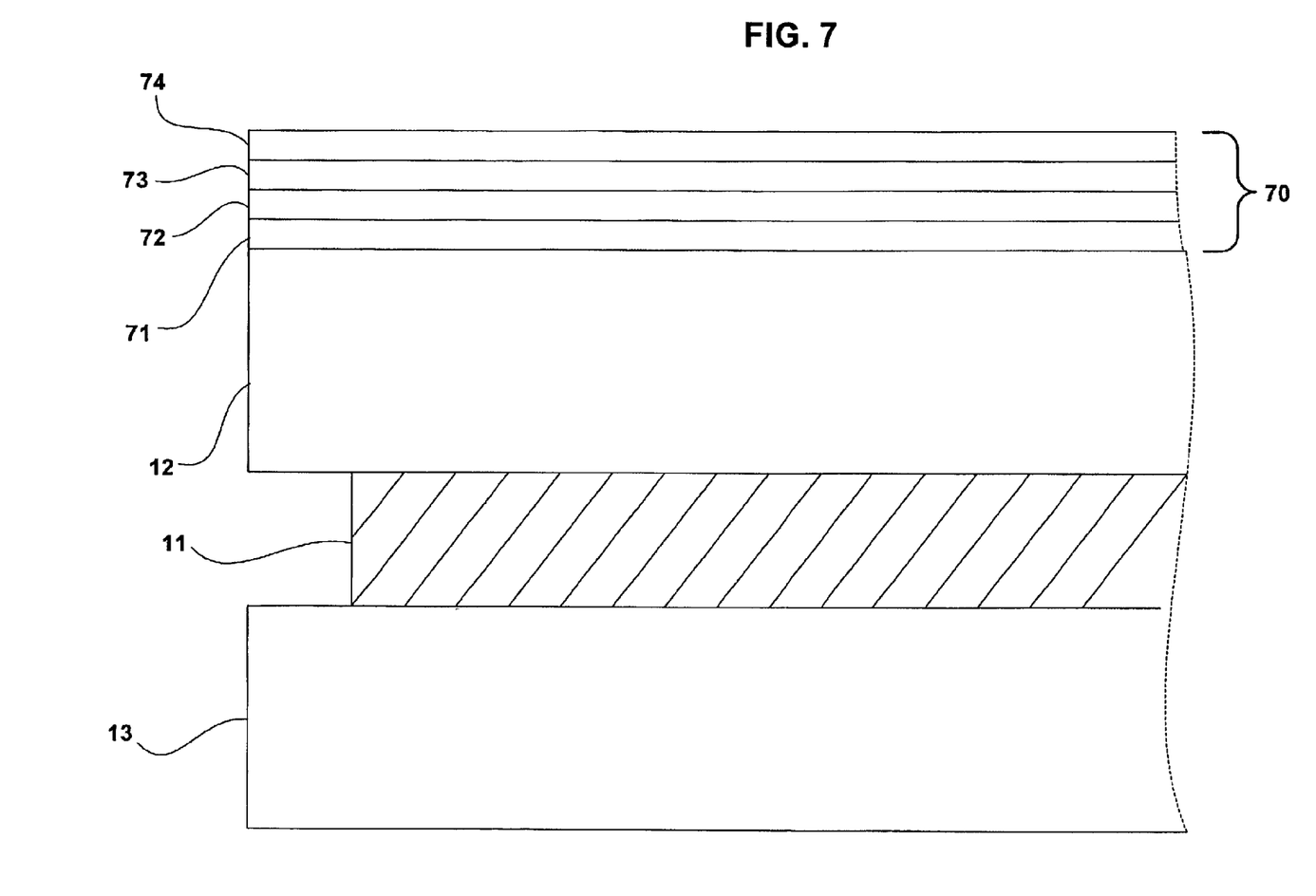
FIG. 7 is a cross-sectional side view of a portion of an exemplary holographic data storage medium according to an embodiment of the invention.

FIG. 7 is an enlarged cross-sectional view of holographic data storage medium 10 including an anti-reflective coating 70 in accordance with an embodiment of the invention. Anti-reflective coating 70 may comprise a multi-layer stack. For example, as illustrated, anti-reflective coating 70 includes four layers. These four layers may be chosen to minimize reflectance and maximize transmittance of S-polarized light over a wide range of incident angles, such as incident angles between approximately 10 and 60 degrees. In some cases, each of the layers comprise oxides, thus avoiding any cross-contamination concerns.

Anti-reflective coating 70 may comprise a first layer 71, a second layer 72, a third layer 73 and a fourth layer 74. Each of these layers may be deposited using deposition techniques such as reactive sputtering, RF sputtering, e-beam evaporation, or other techniques. The composition and thicknesses of the layers can be chosen to minimize reflectance and maximize transmittance of S-polarized light specifically for desired wavelengths. The two tables below provide suitable composition and thicknesses of the layers for green light having wavelengths on the order of 532 nanometers (TABLE 1) and violet light having wavelengths on the order of approximately 405 nanometers (TABLE 2).

TABLE 1

| Layer | Material | Thickness | Index of Refraction (n) at 532 nm | Coefficient of Absorption (k) at 532 nm |
|---|---|---|---|---|
| Substrate | APO | 1.2 mm | 1.555 | 0.000 |
| 1 | ZnS/SiO$_2$ | 108 nm | 2.18 | 0.010 |
| 2 | SiO[x]N[y] | 133 nm | 1.64 | 0.000 |
| 3 | ZnS/SiO$_2$ | 55 nm | 2.18 | 0.010 |
| 4 | SiO$_2$ | 99 nm | 1.47 | 0.000 |

Table 1 lists materials and thicknesses for creating a four-layer anti-reflective coating on an amorphous polyolefin (APO) substrate of a holographic data storage medium that is recorded and read with green light having wavelengths on the order of approximately 532 nanometers. In that case, the anti-reflective coating may have less than 0.25 percent reflectivity for S-polarization over a range of incident angles from approximately 10 degrees to 60 degrees relative to a line normal to the surface of the medium. In addition, the coating can maintain greater than approximately 95 percent transmittance for the S-polarized light.

Layers 1 and 3 may comprise a mixture of ZnS/SiO$_2$. For example, the mixture may comprise approximately 80 percent by weight ZnS and 20 percent by weight SiO$_2$. The second layer may comprise SiO$_{[X]}$N$_{[Y]}$, where X and Y represent rational numbers. The values of X and Y may be chosen to meet applicable specifications for transmittance and reflectivity. Typical values of X may be between approximately 0 and 2, and typical values of Y may be between approximately 0 and 1.33. The value of the sum of X/2+Y/1.33 can be made to be approximately equal to 1.0. The fourth layer substantially comprises SiO$_2$, but may optionally include a small amount of nitrogen.

The thicknesses of the layers may be adjusted to suit different specifications. For example, if the medium is designed for operation with slightly different wavelengths of light, the thicknesses of the layers may be adjusted to ensure that the medium meets anti-reflection and transmissivity specifications.

Moreover, transmissivity and anti-reflection may represent trade-off variables. In other words, in some cases, it may be desirable to achieve even better anti-reflection characteristics at the expense of transmissivity, or vice versa.

Meeting the specification of less than 0.25 percent reflectivity for S-polarization of a range of incident angles from approximately 10 degrees to 60 degrees relative to a line normal to the surface of the medium and greater than approximately 95 percent transmittance for the S-polarized light becomes even more challenging when the holographic media is designed for operation with shorter wavelength light, because many materials tend to have higher absorption coefficients at shorter wavelengths. In that case, transmittance can be significantly reduced. Table 2 lists materials and thicknesses for creating a four layer anti-reflective coating on an amorphous polyolefin (APO) substrate of a holographic data storage medium that is recorded and read with violet light having wavelengths on the order of approximately 405 nanometers. The four-layer coating listed in Table 2 also meets the specification of less than 0.25 percent reflectivity for S-polarization for a range of incident angles from approximately 10 degrees to 60 degrees relative to a line normal to the surface of the medium, and greater than approximately 95 percent transmittance for the S-polarized light.

TABLE 2

| Layer | Material | Thickness | Index of Refraction (n) at 405 nm | Coefficient of Absorption (k) at 405 nm |
|---|---|---|---|---|
| Substrate | APO | 1.2 mm | 1.555 | 0.000 |
| 1 | $Ta_2O_5$ | 83.3 nm | 2.18 | 0.001 |
| 2 | $Al_2O_3$ | 96.8 nm | 1.65 | 0.001 |
| 3 | $Ta_2O_5$ | 42.0 nm | 2.18 | 0.001 |
| 4 | $SiO_2$ | 75.0 nm | 1.48 | 0.000 |

The thicknesses of the coatings listed in Tables 1 and 2 may be adjusted in order to achieve desired performance, depending on the holographic techniques used. For example, if shift-multiplexing is used, it may be desirable to substantially minimize reflectivity, specifically for a chosen incident angle. Accordingly, the thicknesses of the layers may be adjusted to effectuate these or other goals.

Figure 8:
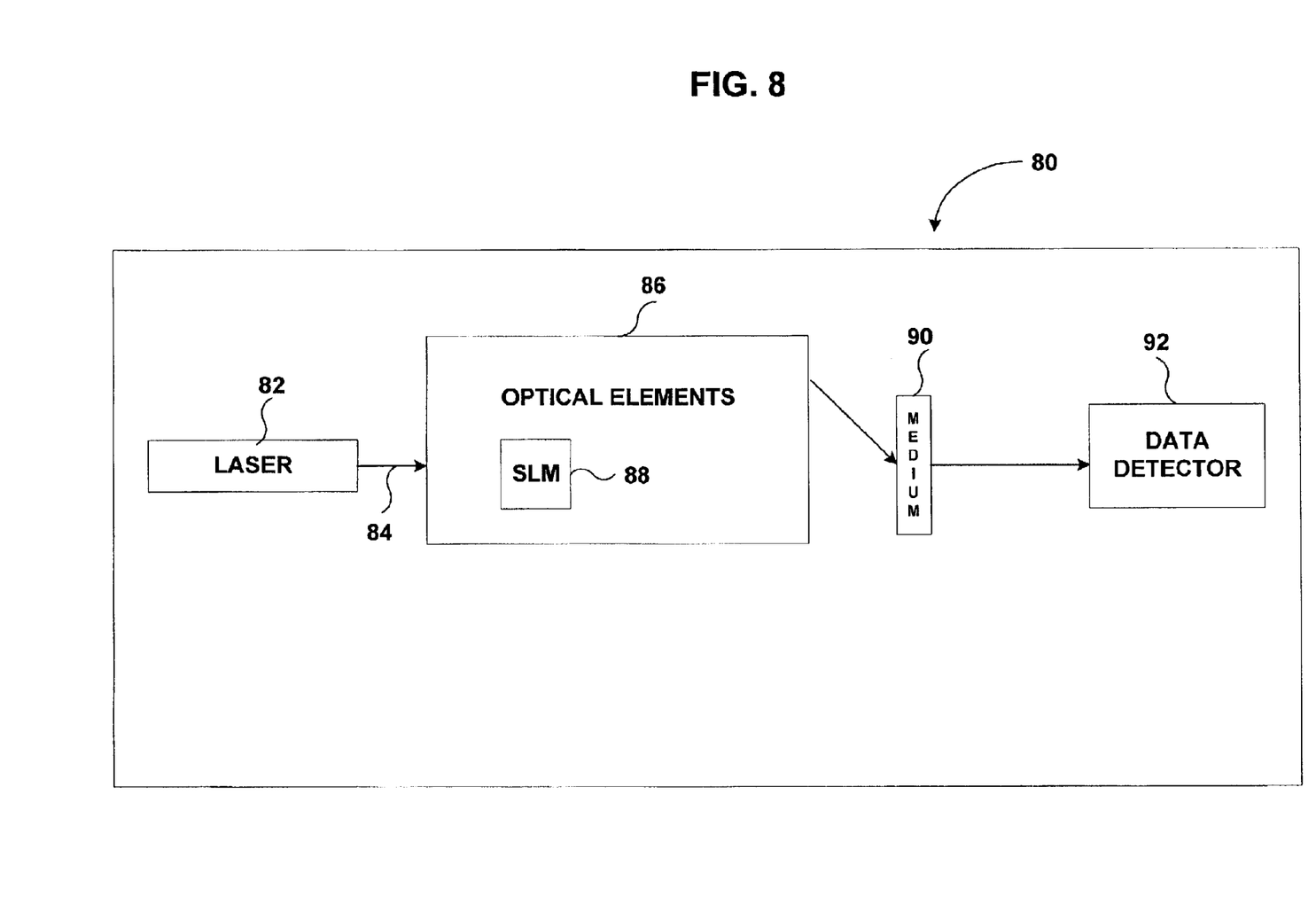
FIG. 8 is a block diagram of a holographic data recording system according to an embodiment of the invention.

FIG. 8 is a block diagram of a holographic data storage system 80 for reading and possibly writing to a holographic recording medium 10. System 80 includes at least one laser 82 that produces laser light 84. Laser light 84 passes through optical elements 86. For instance, optical elements 86 may include one or more beam splitters, lenses and mirrors. A data encoder, such as spatial light modulator (SLM) 88 may be positioned within the optical elements to encode data in the laser light 84. Medium 10 is positioned where it can be written with holographic bit maps. Medium 10, for instance, may include one or more of the features described above, including the anti-reflective coating.

Data detector 92, such as a camera, is positioned to detect data encoded bit maps on medium 10.

In the system, at least one laser 82 may be carried on a record/read head (not shown). Additional lasers (not shown) may also be carried on the record/read head. In this manner, laser 82 may be properly positioned to read and write holograms on the medium 10, even at large incident angles. In particular, the anti-reflective coatings described herein may facilitate holographic recording and holographic readout at the large incident angles. The anti-reflective coatings can reduce the noise within system 80, and at the same time increase the available storage capacity of medium 10.

Various embodiments of the invention have been described. For example, anti-reflective coatings for holographic data storage media have been described which reduce reflectivity for S-polarization over a wide range of incident angles. Moreover, the described anti-reflective coatings may have a sufficiently high transmittance for the S-polarized light. Nevertheless, various modifications can be made without departing from the spirit and scope of the invention. For example, other materials or other thickness combinations of the described materials may be used to achieve the anti-reflection characteristics and tranmissive qualities described herein. In addition, the invention may be implemented to improve holographic media used in angle-multiplexing systems, shift-multiplexing systems, combination systems implementing both angle and shift-multiplexing techniques, or other systems. These and other embodiments are within the scope of the following claims.

What is claimed is:

1. A holographic data storage medium including an anti-reflective coating on a surface of the medium, wherein the anti-reflective coating limits reflectivity such that the medium exhibits less than 1.0 percent reflectivity of S-polarized light at incident angles greater than approximately 50 degrees relative to a line normal to the surface of the medium, wherein the anti-reflective coating includes:
a first layer comprising $Ta_2O_5$,
a second layer comprising $Al_2O_3$,
a third layer comprising $Ta_2O_5$, and
a fourth layer comprising $SiO_2$.

2. The holographic data storage medium of claim 1, wherein the anti-reflective coating limits reflectivity such that the medium exhibits less than 1.0 percent reflectivity of S-polarized light at an incident angle of approximately 60 degrees relative to a line normal to the surface of the medium.

3. The holographic data storage medium of claim 2, wherein the anti-reflective coating limits reflectivity such that the medium exhibits less than 0.5 percent reflectivity of S-polarized light at an incident angle of approximately 60 degrees relative to a line normal to the surface of the medium.

4. The holographic data storage medium of claim 3, wherein the anti-reflective coating limits reflectivity such that the medium exhibits less than 0.25 percent reflectivity of S-polarized light at an incident angle of approximately 60 degrees relative to a line normal to the surface of the medium.

5. The holographic data storage medium of claim 1, wherein the anti-reflective coating limits reflectivity such that the medium exhibits less than 1.0 percent reflectivity of S-polarized light at incident angles relative to a line normal to the surface of the medium greater than or equal to approximately 10 degrees and less than or equal to approximately 60 degrees.

6. The holographic data storage medium of claim 1, wherein the anti-reflective coating has greater than approximately 95 percent transmittance for the S-polarized light.

7. The holographic data storage medium of claim 1, wherein the S-polarized light comprises S-polarized light having a wavelength of approximately 405 nanometers.

8. The holographic data storage medium of claim 1, wherein:

the first layer a thickness of approximately 83.3 nanometers, the second layer has a thickness of approximately 96.8 nanometers, the third layer has a thickness of approximately 42.0 nanometers, and the fourth layer has a thickness of approximately 75.0 nanometers.

9. The holographic data storage medium of claim 1, wherein the medium has a sandwich construction in which a photopolymer is sandwiched between two substrates, and wherein the anti-reflective coating on the surface of the medium comprises an anti-reflective coating of an outer surface of one of the substrates.

10. The holographic data storage medium of claim 9, further comprising anti-reflective coatings on outer surfaces of both of the substrates.

11. A holographic data storage medium including an anti-reflective coating on a surface of the medium, wherein the anti-reflective coating limits reflectivity such that the medium exhibits less than 1.0 percent reflectivity of S-polarized light at incident angles greater than approximately 50 degrees relative to a line normal to the surface of the medium, wherein the anti-reflective coating includes:

a first layer comprising approximately 80 percent by weight ZnS and approximately 20 percent by weight $SiO_2$, a second layer comprising $SiO[_X]N[_Y]$, wherein X is a rational number between approximately 0 and 2 and wherein Y is a rational number between approximately 0 and 1.33, a third layer of comprising approximately 80 percent by weight ZnS and approximately 20 percent by weight $SiO_2$, and a fourth layer comprising $SiO_2$.

12. The holographic data storage medium of claim 11, wherein the S-polarized light comprises S-polarized light having a wavelength of approximately 532 nanometers.

13. The holographic data storage medium of claim 11, wherein:

the first layer has a thickness of approximately 108 nanometers, the second layer has a thickness of approximately 133 nanometers, the third layer has a thickness of approximately 55 nanometers, and the fourth layer has a thickness of approximately 99 nanometers.

14. The holographic data storage medium of claim 11, wherein a value of the sum of X/2 and Y/1.33 is approximately equal to 1.0.

15. A holographic data storage system comprising:

a laser that produces at least one laser beam;

optical elements through which the laser beam passes;

a holographic recording medium including an anti-reflective coating on a surface of the medium, wherein the anti-reflective coating limits reflectivity such that the medium exhibits less than 1.0 percent reflectivity of S-polarized light at an incident angle greater than approximately 50 degrees relative to a line normal to the surface of the medium, wherein the anti-reflective coating includes a first layer comprising $Ta_2O_5$, a second layer comprising $Al_2O_3$, a third layer comprising $Ta_2O_5$, and a fourth layer comprising $SiO_2$; and a data detector that detects a hologram reconstructed when the laser beam illuminates the holographic recording medium at an incident angle greater than approximately 50 degrees relative to a line normal to the surface of the medium.

16. A method comprising:

forming an anti-reflective coating on a holographic data storage medium to limit reflectivity of S-polarized light at incident angles greater than approximately 50 degrees relative to a line normal to the surface of the medium to less than approximately 1.0 percent, wherein forming the anti-reflective coating includes:

forming a first layer comprising $Ta_2O_5$;

forming a second layer comprising $Al_2O_3$;

forming a third layer comprising $Ta_2O_5$; and forming a fourth layer comprising $SiO_2$.

17. The method of claim 16, further comprising forming the anti-reflective coating such that transmittance of the coating is greater than approximately 95 percent.

18. The method of claim 16, further comprising:

storing a hologram in the holographic data storage medium using an object beam and a reference beam directed toward the holographic data storage medium, wherein at least one of the object beam and reference beam is directed toward the holographic data storage medium at an incident angle greater than approximately 50 degrees relative to a line normal to the surface of the medium.

19. The method of claim 16, further comprising:

reconstructing a hologram stored in the holographic data storage medium using the reference beam directed toward the holographic data storage medium at an incident angle greater than approximately 50 degrees relative to a line normal to the surface of the medium.

20. A holographic data storage system comprising:

a laser that produces at least one laser beam;

optical elements through which the laser beam passes;

a holographic recording medium including an anti-reflective coating on a surface of the medium, wherein the anti-reflective coaxing limits reflectively such that the medium exhibits less than 1.0 percent reflectivity of S-polarized light at an incident angle greater than approximately 50 degrees relative to a line normal to the surface of the medium wherein the anti-reflective coating includes:

a first layer comprising approximately 80 percent by weight ZnS and approximately 20 percent by weight $SiO_2$, a second layer comprising $SiO[_X]N[_Y]$, wherein X is a rational number between approximately 0 and 2 and wherein Y is a rational number between, approximately 0 and 1.33, a third layer of comprising approximately 80 percent by weight ZnS and approximately 20 percent by weight $SiO_2$, and a fourth layer comprising $SiO_2$; and a data detector that detects a hologram reconstructed when the laser beam illuminates the holographic recording medium at an incident angle greater than approximately 50 degrees relative to the line normal to the surface of the medium.

21. A method comprising:

forming an anti-reflective coating on a holographic data storage medium to limit reflectivity of S-polarized light at incident angles greater than approximately 50 degrees relative to a line normal to the surface of the medium to less than approximately 1.0 percent, wherein forming the anti-reflective coating includes:

forming a first layer comprising approximately 80 percent by weight ZnS and approximately 20 percent by weight $SiO_2$, forming a second layer comprising $SiO_{[X]}N_{[Y]}$, wherein X is a rational number between approximately 0 and 2 and wherein Y is a rational number between approximately 0 and 1.33, forming a third layer of comprising approximately 80 percent by weight ZnS and approximately 20 percent by weight $SiO_2$, and forming a fourth layer comprising $SiO_2$.

* * * * *

UNITED STATES PATENT AND TRADEMARK OFFICE
CERTIFICATE OF CORRECTION

PATENT NO. : 6,839,177 B2
DATED : January 4, 2005
INVENTOR(S) : Frank E. Aspen

It is certified that error appears in the above-identified patent and that said Letters Patent is hereby corrected as shown below:

Column 9,
Line 6, "layer a" should read -- layer has a --.

Column 10,
Line 52, "coaxing" should read -- coating -- and "reflectively" should read
-- reflectivity --.
Lines 63-64, "between, approximately" should read -- between approximately --.
Line 65, "layer of comprising" should read -- layer comprising --.

Signed and Sealed this

Sixth Day of September, 2005

JON W. DUDAS
*Director of the United States Patent and Trademark Office*